(12) United States Patent
Zywicki et al.

(10) Patent No.: US 9,857,223 B2
(45) Date of Patent: Jan. 2, 2018

(54) PROXIMITY FOCUS IMAGING INTERFEROMETER

(71) Applicant: RAYTHEON COMPANY, Waltham, MA (US)

(72) Inventors: Randall W. Zywicki, McKinney, TX (US); David C. Mann, Frisco, TX (US); Andre D. Cropper, Prosper, TX (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 14/947,238

(22) Filed: Nov. 20, 2015

(65) Prior Publication Data
US 2017/0146400 A1   May 25, 2017

(51) Int. Cl.
*G01J 3/26* (2006.01)
*B81B 7/00* (2006.01)
*G01J 3/28* (2006.01)

(52) U.S. Cl.
CPC .......... *G01J 3/26* (2013.01); *B81B 7/00* (2013.01); *G01J 3/2803* (2013.01)

(58) Field of Classification Search
CPC .......... G01J 3/26; G01J 3/0256; G01J 3/0259; G01B 2290/25; G01L 9/0079; G02B 26/001; G02B 5/28; G02B 5/281; G02B 5/284; G02B 6/29358; G02B 6/29395; G02F 1/21; G02F 2001/213
USPC ................................. 356/454, 519
See application file for complete search history.

(56) References Cited

U.S. PATENT DOCUMENTS

| | | |
|---|---|---|
| 4,743,114 A | 5/1988 | Crane, Jr. |
| 4,917,476 A | 4/1990 | Makh et al. |
| H1152 H | 3/1993 | Korendyke |
| 5,218,426 A | 6/1993 | Hall et al. |
| 5,502,563 A | 3/1996 | Dunn et al. |
| 5,550,373 A | 8/1996 | Cole et al. |

(Continued)

FOREIGN PATENT DOCUMENTS

WO    WO 2010133642 A1 * 11/2010 ............... G01J 3/02

OTHER PUBLICATIONS

Chee, et al., "Large Size MOEMS Fabry-Perot Interferometer Filter for Focal Plane Array Hyperspectral Imaging", 9375, MOEMS and Miniaturized Systems XIV, 93750K, Feb. 27, 2015, 7 Pages.

(Continued)

*Primary Examiner* — Tarifur Chowdhury
*Assistant Examiner* — Jonathon Cook
(74) *Attorney, Agent, or Firm* — Lando & Anastasi, LLP

(57) ABSTRACT

An interferometer system comprising an optical detector including a substrate and a two-dimensional array of pixels disposed on the substrate is provided. The interferometer system may further comprise an interferometer disposed proximate the optical detector without an optical element between the interferometer and the optical detector. The interferometer may include a first plate positioned proximate the substrate and extending over the two-dimensional array of pixels, a second plate spaced apart from the first plate, the first and second plates defining an optical gap between them, and at least one actuatable spacer positioned between the first plate and the second plate and configured to space apart the first and second plates from one another and to selectively alter a thickness of the optical gap.

13 Claims, 5 Drawing Sheets

(56) References Cited

U.S. PATENT DOCUMENTS

| | | | |
|---|---|---|---|
| 6,295,130 B1* | 9/2001 | Sun | G01J 3/26 356/454 |
| 6,522,471 B2 | 2/2003 | Clark | |
| 6,985,233 B2 | 1/2006 | Tuschel et al. | |
| 7,460,247 B1 | 12/2008 | Ackerman | |
| 7,554,667 B1 | 6/2009 | Kampe | |
| 8,143,577 B2* | 3/2012 | Shen | G01J 3/26 250/338.1 |
| 8,780,356 B1 | 7/2014 | Saari et al. | |
| 2007/0081156 A1 | 4/2007 | Treado et al. | |
| 2009/0220189 A1* | 9/2009 | Kiesel | G01J 3/02 385/12 |
| 2012/0127471 A1* | 5/2012 | Urushidani | G02B 26/001 356/450 |
| 2012/0206813 A1* | 8/2012 | Bahat | G02B 26/001 359/578 |
| 2014/0354999 A1* | 12/2014 | Englund | G01J 3/26 356/456 |

OTHER PUBLICATIONS

Daly, et al., "Tunable Narrow-Band Filter for LWIR Hyperspectral Imaging", SPIE 3948, Photodetectors: Materials Devices V, 104, Apr. 13, 2000, pp. 104-115.

De Natale, et al., "MEMS Tunable Filters for LWIR Spectral Imaging", Optical MEMS and Nanophotonics, 2007, pp. 169-170.

Ebermann, et al., "Widely Tunable Fabry-Perot Filter Based MWIR and LWIR Microspectrometers", SPIE 8374, Next-Generation Spectroscopic Technologies V, 83740X, May 1, 2012, 9 Pages.

Faraone, "An Overview of Research Activities Related to MEMS and Infrared Materials, Devices and Technology", Presentation: Head, Microelectronics Research Group, School of Electrical, Electronic and Computer Engineering, The University of Western Australia, Nov. 2014, 37 Pages.

Faraone, et al., "Optical MEMS for Multi-Spectral 2-D Imaging FPAs and Chem/Bio Sensing: From NIR to LWIR", Presentation: Head, Microelectronics Research Group, School of Electrical, Electronic and Computer Engineering, The University of Western Australia, Nov. 2014, 38 Pages.

Gunning, "Adaptive Focal Plane Array—A Compact Spectral Imaging Sensor", Teledyne Scientific & Imaging LLC, Conference Presentation, Mar. 5, 2007, 18 Pages.

Gunning, et al., "Adaptive Focal Plane Array—An Example of MEMS, Photonics, and Electronics Integration", SPIE, vol. 5783, Infrared Technology and Applications XXXI, Jun. 3, 2005, pp. 366-375.

Gunning, et al., "Dual Band Adaptive Focal Plane Array an Example of the Challenge and Potential of Intelligent Integrated Microsystems(*)", SPIE, vol. 6232, Infrared Technology and Applications 62320F, May 18, 2006, 9 Pages.

Gunning, et al., "MEMS-Based Tunable Filters for Compact IR Spectral Imaging", SPIE 7298, Infrared Technology and Applications XXXV, 729821, May 6, 2009, 9 Pages.

Gupta, et al. "Progress in AOTF Hyperspectral Imagers", SPIE 4054, Automated Geo-Spatial Image and Data Exploitation, Jul. 27, 2000, pp. 30-38.

Hinnrichs, et al., "Next Generation Miniature Simultaneous Multi-Hyperspectral Imaging Systems", SPIE 8977, Moems and Miniaturized Systems XIII, 89770D, Mar. 7, 2014, 9 Pages.

Lucey, et al., "A Compact LWIR Hyperspectral System Employing a Microbolometer Array and a Variable Gap Fabry-Perot Interferometer Employed as a Fourier Transform Spectrometer", SPIE 8390, Algorithms and Technologies for Multispectral, Hyperspectral, and Ultraspectral Imagery XVIII, 83900R, May 8, 2012, 8 Pages.

Mitra et al., "Adaptive Focal Plane Array (AFPA) Technologies for Integrated Infrared Microsystems*", SPIE 6232, Intelligent Integrated Microsystems, 62320G, May 18, 2006, 11 Pages.

Zolper, et al., "The Path to Adaptive Microsystems", SPIE 6232, Intelligent Integrated Microsystems, 623201, May 18, 2006, 14 Pages.

International Search Report and Written Opinion for application No. PCT/US2016/051991 dated Dec. 1, 2016.

Mao et al., "Towards longwave infrared tuneable filters for multispectral thermal imaging applications" Conference Paper of 2014 Quantitative InfraRed Thermography in The e-Jounral of Nondestructive Testing, vol. 20, No. 5, 2015. DOI: 10.21611/qirt.2014.071 Retrieved from the Internet: <URL: http://www.ndt.net/article/qirt2014/papers/QIRT-2014-071.pdf>.

* cited by examiner

PROXIMITY FOCUS IMAGING INTERFEROMETER

BACKGROUND

An optical interferometer is a device that employs the effects of electromagnetic radiation interference. The electromagnetic radiation that enters the interferometer undergoes multiple reflections and the interference of the electromagnetic radiation emerging from the interferometer during each "bounce" causes a modulation in the transmitted and reflected beams. The interference of waves is the process whereby two or more waves of the same frequency or wavelength combine to form a wave whose amplitude is the sum of the amplitudes of the interfering waves. Constructive and destructive interference occurs based on the angle of the beam, the optical thickness of the interferometer, and the wavelength. The transmission spectrum of the interferometer imaging system displays a series of peaks where constructive interference occurs.

Applications in which interferometers are used as a tool include metrology, spectroscopy, and astronomy. These applications require measurement of small displacements, refractive index changes, and surface irregularities. In addition, these functions require precise measurements of wavelength, the measurement of very small distances and thicknesses, the detailed study of the hyperfine structure of spectrum lines, the precise determination of refractive indices, and, in astronomy, the measurement of binary-star separations and the diameters of stars. Optical interferometers are based on both two-beam interference and multiple-beam interference.

A typical Fabry-Perot interferometer comprises a pair of substantially parallel reflective surfaces, or two parallel highly reflecting mirrors, that are spaced apart to define an optical gap. In some Fabry-Perot interferometers, at least one of the surfaces is movable relative to the other in order to vary the size of the optical gap. In other Fabry-Perot interferometers, the optical gap is fixed, and the optical path length may be varied by tilting the interferometer or varying the air pressure. In use, electromagnetic radiation comprising a number of different wavelengths impinges on the interferometer and passes into the optical gap and is then reflected between the two reflective surfaces. Constructive and destructive interference occurs, leading to certain well-defined wavelengths being transmitted through the interferometer while the remaining wavelengths are not transmitted. In typical Fabry-Perot interferometers, a series of well-defined transmission peaks are obtained corresponding to wavelengths that are transmitted, the wavelengths at which the peaks are situated being adjustable by varying the width of the optical gap. The transmission spectrum as a function of wavelength exhibits peaks of large transmission corresponding to resonances of the interferometer. As the reflectivity of the mirrors is increased, the modulation peaks become sharper and decrease in width.

In traditional Fabry-Perot interferometers, it is important that the reflective surfaces of the interferometer are as parallel as possible in order to minimize distortions that can degrade image or electromagnetic radiation quality. For example, a traditional Fabry-Perot interferometer may require a degree of parallelism of less than ¼ of the wavelength of the source of electromagnetic radiation. This requirement limits the choice of materials as well as the size of the imaging system.

A typical Fabry-Perot interferometer is spatially separated from the focal plane, and the system requires additional imaging optics between the interferometer and the focal plane. Spectral imaging systems for thermal infrared applications, including Fabry-Perot interferometers, are typically inherently large in size, weight, power, and cost compared to spectral instruments for shorter optical wavelengths. The signal levels are generally low due to the narrow spectral bandwidth of individual channels, and thus the thermal self emission of the optics must be reduced to yield acceptable sensor noise performance. This frequently leads to the need for cryogenic cooling of most or all of the imaging optics. Cryogenic cooling requires a Dewar large enough to hold a spectrometer or interferometer, and a cooler large enough to cool this considerable thermal mass in an acceptable period of time.

SUMMARY OF THE INVENTION

Aspects and embodiments are directed generally to optical systems and methods, and more particularly, to spectral imaging systems and methods. Specifically, various aspects and embodiments are directed to an imaging system including Fabry-Perot interferometer in close proximity to a focal plane, the Fabry-Perot interferometer configured to focus incident electromagnetic energy onto imaging sensor(s) located at the focal plane. In accordance with various aspects and embodiments, there are provided systems and methods of fabricating and using an apparatus including Fabry-Perot interferometers in close proximity to a focal plane array (FPA) designed to improve the collecting efficiency of electro-optical detector FPAs, wherein the active area of the FPA comprises a two-dimensional array pixel sensors. A Fabry-Perot interferometer disposed above the FPA detector pixels effectively increases the collection efficiency thereby improving detection sensitivity for passive electro-optic/infrared (EO/IR) receivers, and decreasing the size of the imaging system.

According to one embodiment, an interferometer system includes an optical detector having a substrate and a two-dimensional array of pixels disposed on the substrate, and an interferometer disposed proximate the optical detector without an optical element between the interferometer and the optical detector, the interferometer including a first plate positioned proximate the substrate and extending over the two-dimensional array of pixels, a second plate spaced apart from the first plate, the first and second plates defining an optical gap between them, and at least one actuatable spacer positioned between the first plate and the second plate and configured to space apart the first and second plates from one another and to selectively alter a thickness of the optical gap.

In one example, the optical detector is a focal plane array detector.

In one example, the interferometer system further includes a reflective coating disposed on interior surfaces of the first plate and the second plate.

In one example, the interferometer system further includes a microelectromechanical system actuator configured to actuate the spacer to selectively alter the thickness of the optical gap.

In one example, the at least one spacer includes piezoelectric materials. The piezoelectric materials may include at least one of lithium tantalite, lithium niobate, lead zirconium titanate, and lanthanum-doped lead zirconium titanate.

In one example, the at least one spacer is positioned between the edges of the first plate and the second plate.

In one example, the at least one spacer is positioned external to the optical gap.

According to another embodiment, a solid state interferometer system includes an optical detector having a substrate and a two-dimensional array of pixels disposed on the substrate, and an interferometer disposed proximate the optical detector without an optical element between the interferometer and the optical detector, the interferometer including a first layer deposited over the two-dimensional array of pixels and configured to reflect optical radiation incident thereon, an actuatable spacer layer deposited over the first layer, the actuatable spacer layer having an electronically variable thickness, and a first reflective coating disposed over an upper surface of the actuatable spacer layer and configured to reflect the optical radiation reflected from the first layer.

In one example, the optical detector is a focal plane array detector.

In one example, the first layer includes a second reflective coating disposed on a surface of the first layer facing the actuatable spacer.

In one example the solid state interferometer system further comprises a second layer deposited over the first reflective coating.

In one example, the actuatable spacer layer includes piezoelectric materials. The piezoelectric materials may include at least one of lithium tantalite, lithium niobate, lead zirconium titanate, and lanthanum-doped lead zirconium titanate.

In one example, the solid state interferometer system further includes an optical train in communication with the optical detector.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
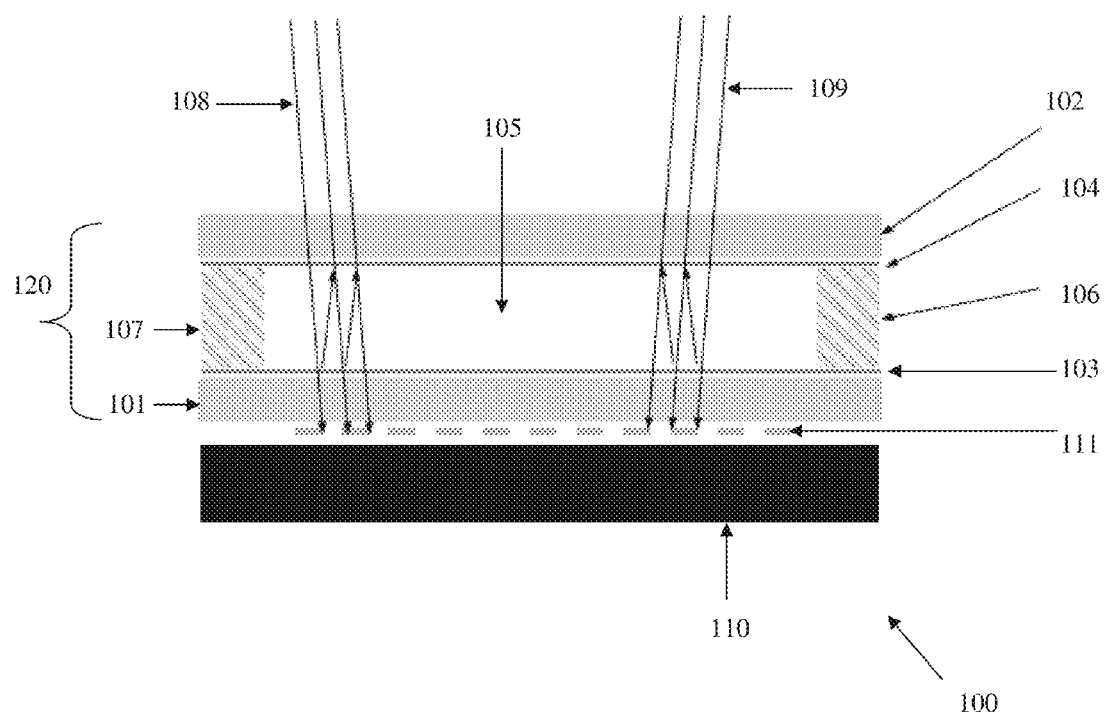
FIG. 1 is a cross-sectional view of one example of a monolithic electromagnetic radiation sensor according to aspects of the present invention.

Aspects and embodiments are generally directed to apparatus and methods for the detection of electromagnetic radiation, and in particular, for the imaging and/or spectral analysis of optical radiation. In the design of electromagnetic radiation sensors, particularly optical sensors, various design considerations are often taken into account to provide for a sensitive, compact system. To reduce the size, weight, power, and cost associated with spectral imaging systems for thermal infrared applications, it is advantageous to minimize the number of components that require cooling so as to minimize the size of the associated Dewar or other cooling chamber and the required cooling power. As discussed above, conventional Fabry-Perot interferometers are spatially separated from the focal plane at which the imaging detectors are located, and require imaging optics positioned between the interferometer and the focal plane. In addition, these imaging systems typically require additional optical elements such as lenslet arrays, for example, "insect eye" arrays, and relay optics in order to produce the image. These components tend to be physically large. Accordingly, conventional systems either require substantial Dewars for high performance or remain uncooled, resulting in significant performance degradation.

Aspects and embodiments are directed to providing a compact imaging device that avoids these drawbacks by creating a very small, low thermal mass interferometer positioned in close proximity to the focal plane array. In particular, as discussed in detail below, certain embodiments include a Fabry-Perot interferometer positioned in close proximity to an infrared focal plane array (FPA) detector. This configuration may provide advantages with regard to, for example, size, weight, ruggedness, and cost compared to conventional imaging systems, as discussed further below. For example, placing the Fabry-Perot interferometer in close proximity to the infrared focal plane array detector obviates the need for ancillary optics, while still producing focused images. Thus, as discussed in more detail below, aspects and embodiments provide a spectrally selective device that is compact enough to fit within a Dewar sized for the associated infrared focal plane array detector, and is compatible with suitable fore-optics, for example, an optical train comprising one or more electromagnetic radiation sources or an optical train comprising one or more mirrors.

Further, to reduce the degree of parallelism required in the Fabry-Perot interferometer, it is also advantageous to position the Fabry-Perot interferometer in close proximity to the FPA. Typical imaging systems comprise solid-state detector arrays that may require a high degree of local parallelism and flatness in the Fabry-Perot interferometer when it is spaced far from the array, so as to reduce distortions perceived by the detector array. In contrast, using an FPA detector having a two-dimensional array of individual detector pixels in close proximity to the interferometer allows the system to exhibit a high degree of parallelism over a small area. Further, in such FPA sensors, if no mechanism for focusing is used, imaging electromagnetic radiation would be wasted in the interstitial gaps between the individual detector pixels. Accordingly, certain examples advantageously provide an FPA sensor with a Fabry-Perot interferometer disposed in close proximity with the FPA to increase the collection efficiency, improve detection sensitivity of the sensor, and allow for use with hyperspectral imaging.

Typical Fabry-Perot interferometers may use the technique of piezo-electric scanning of the interferometer free spectral range (FSR). As discussed in more detail below, certain embodiments, however, may use a thin film of optically transparent piezoelectric material to scan the required distance. The distance may be, for example, between about 10 μm and about 20 μm. The pass band wavelength of a Fabry-Perot interferometer can be controlled by adjusting the distance between the mirrors. An exemplary method used with a scanning Fabry-Perot interferometer is to move one of the two reflecting plates mechanically. In certain examples, because the mechanical scanning distance necessary is in the order of the electromagnetic radiation wavelength, this scanning can be done by piezoelectric actuators. Piezoelectric scanning allow for both slow and fast scanning modes, and allows for the scanning voltage to be directly used as measure for the plate position. In addition, the final adjustment can be easily done by automatically or manually adjusting the drive voltages of the piezo stacks, as discussed further below.

It is to be appreciated that this invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

Referring to FIG. 1, there is illustrated in cross-section a portion of one example of the electromagnetic radiation sensor, indicated generally at 100, in accordance with certain embodiments. The electromagnetic radiation sensor 100 comprises a focal plane array (FPA) having a common substrate 110 and detector pixels 111, and an interferometer having first and second plates 101, 102, and optical spacers 106, 107. In one embodiment, interferometer 120 is a Fabry-Perot interferometer. In one example, a plurality of detector pixels 111, for example, several thousand, may be formed together on a common substrate 110 to form a FPA sensor system 110. For example, in some embodiments, the FPA sensor system may include a 1040 by 720 array of detector pixels 111; however, arrays of any size may be used. The plurality of detector pixels 111 may be, for example, disposed on a surface of the substrate 110 or embedded in substrate 110. Substrate 110 may provide support for detector pixels 111.

Embodiments of the electromagnetic radiation sensor 100 may be used to detect a specific wavelength or band of electromagnetic radiation 108, 109 and/or to image an object using this specific wavelength or band of electromagnetic radiation 108, 109. In one embodiment, electromagnetic radiation 108, 109 may be infrared electromagnetic radiation. As discussed above, according to certain embodiments, the FPA sensor 100 includes an array of detector pixels 111 configured to focus incident electromagnetic radiation in the wavelength range, or waveband, of interest. The electromagnetic radiation detector element 110 produces a signal responsive to being exposed to the specific wavelength of electromagnetic radiation of interest, and an image may be constructed from the signals from the one or more electromagnetic radiation detector elements in the electromagnetic radiation sensor.

It may be desirable that the Fabry-Perot interferometer used in the electromagnetic sensor 100 is thin. There are several challenges associated with achieving this design goal. For example, the interferometer window thickness, spacer thickness, and detector pixel spacing may be small enough to minimize pixel crosstalk without the need for additional optical elements, as discussed further below. It may be preferable that interferometer 120 functions as a tunable bandpass filter, with spectral scanning accomplished by actuating spacers. The high collecting efficiency achieved by directing nearly all the photons over the detector pixels is desirably not compromised by the loss of photons due to absorption within the optical gap 105 of the Fabry-Perot interferometer.

Aspects and embodiments of a design of the electromagnetic radiation sensor 100 disclosed herein are capable of achieving performance desired for use in many FPA array sensors, while being compact enough to fit within a tactical Dewar.

Still referring to FIG. 1, the first and second plates 101, 102 can be considered as two parallel plates forming a thin Fabry-Perot interferometer with an optical gap 105 located in between. Incident light within the optical gap can experience multiple reflections at the plates resulting in both transmission and reflection characteristics which depend on the wavelength, layer thickness, and the fine structure of the plates. Reflectivity of first and second plates 101, 102 can be provided by reflective coatings 103 and 104, respectively. Reflective coatings 103, 104 are provided on the interior surfaces of first and second plates 101, 102. In addition the exterior face of first plate 101 may comprise an anti-reflective coating (not shown). The anti-reflective coating on the exterior face of first plate 101 may be configured to filter the incoming electromagnetic radiation. In at least one embodiment, first plate 101 and second plate 102 may be configured to filter electromagnetic radiation. For example, first plate 101 and second plate 102 may be configured to block particular wavelengths of electromagnetic radiation and to allow other wavelengths of electromagnetic radiation to pass through.

In at least one embodiment, the cavity of interferometer 120 is formed by the optical gap 105. Radiation in the optical gap 105 propagates and refracts as in optically homogeneous media. For normal incidence at the surfaces, the corresponding transmitted and reflected waves are vertically propagating plane waves. Inside the first plate 101 and second plate 102, however, electromagnetic radiation is represented by the modes of the surface. The reflectivity of first plate 101 and second plate 102 can be reduced to almost zero when reflections from the two plates are accurately anti-phased and the reflectivity for both plates is almost the same. The reflectivity of first plate 101 and second plate 102 may be determined by reflective coatings 103, 104. When the reflections of first plate 101 and second plate 102 are accurately anti-phased and the reflectivity for both plates is almost the same, the transmissions through the optical gap 105 will be close to 100%. In some embodiments, optical gap 105 may comprise an optically transparent material. In other embodiments, the optical properties of optical gap 105 may be uniform; however, in other embodiments, the optical properties of optical gap 105 are not uniform. Preferably, the size of optical gap 105 is such that very little diffusion occurs across the array of detector pixels 111.

In one embodiment, optical gap 105 may comprise a material that may additionally provide an anti-reflection (AR) function. Further, in some embodiments, transmitted radiation passes through the same surface multiple times, and the optical phase delay becomes stronger compared with a single-pass through the same layer. Both of these effects, namely reduced insertion loss due to the antireflective property and enhanced amplitude on transmission may be utilized in the design of embodiments of the electromagnetic radiation sensor 100.

In some embodiments, electrically variable etalon spacers 106 and 107 are disposed between the edges of the first plate 101 and second plate 102. Electrically variable etalon spacers 106 and 107 may be used to "tune" the interferometer. Spacers 106 and 107 keep first plate 101 and second plate 102 in a straight and uniform position. A suitable tension can be created and maintained for a movable mirror. Spacers 106 and 107 are not optically active. In some embodiments, spacers 106 and 107 may be an annulus.

In an embodiment, electrically variable etalon spacers 106 and 107 comprise piezoelectric materials. For example spacers 106 and 107 may be at least one of lithium tantalite (LiTaO$_3$), lithium niobate (LiNbO$_3$), lead zirconium titanate (PZT), and lanthanum-doped lead zirconium titanate (PLZT).

In some embodiments, electrically variable etalon spacers 106 and 107 may be actuated by piezoelectric actuators. In other embodiments, electrically variable etalon spacers 106 and 107 may be actuated by electrical actuators. In still other embodiments, electrically variable etalon spacers 106 and 107 may be actuated by mechanical actuators. In certain conventional interferometer systems, microelectromechanical system (MEMS) actuators are used to cause the required movement of the interferometer plate(s), particularly in those systems where individual interferometers are associated with individual detector pixels. In contrast, however, according to certain embodiments the electrically variable etalon spacers 106 and 107 are not actuated by MEMS actuators because the size of the Fabry-Perot interferometer plates, which can extend over the entire array of detector pixels rather than being associated within only an individual pixel, is too large for a MEMS actuator to be used. Instead, in certain examples, piezoelectric actuators can be used, as discussed above.

Figure 2:
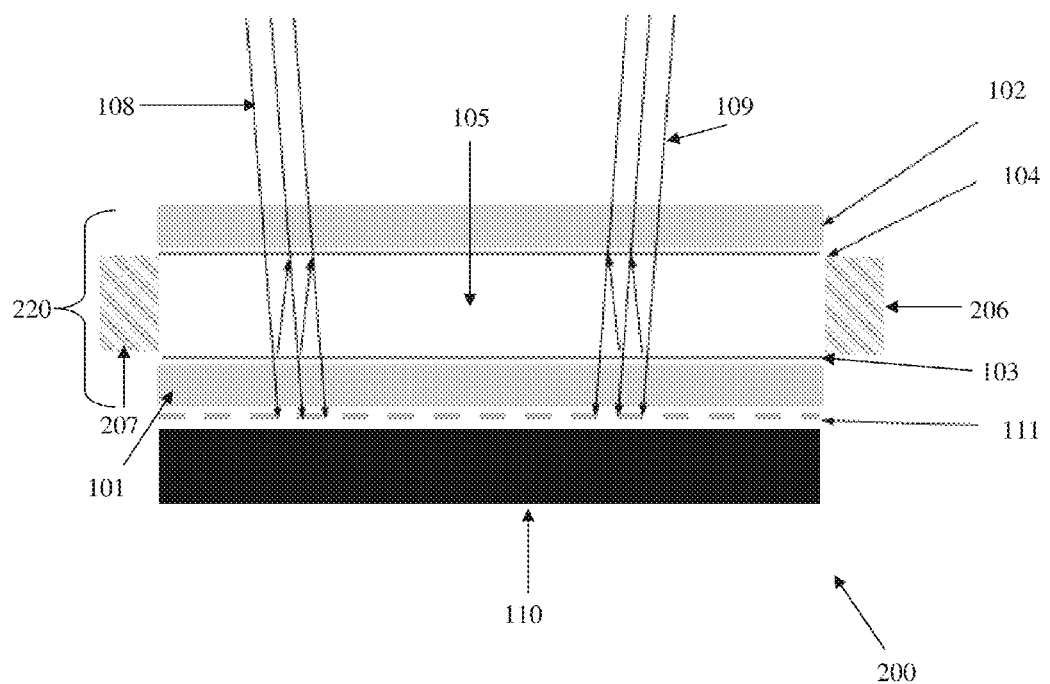
FIG. 2 is a cross-sectional view of another example of a monolithic electromagnetic radiation sensor according to aspects of the present invention.

Referring to FIG. 2, there is illustrated in cross section a portion of an exemplary electromagnetic radiation sensor, indicated generally at 200, in accordance with certain embodiments. FIG. 2 illustrates a Fabry-Perot interferometer 220 in close proximity to an FPA sensor system having a common substrate 110 and detector pixels 111. In some embodiments, electrically variable etalon spacers 206 and 207 are disposed external to optical gap 105, instead of between the edges of first plate 101 and second plate 102. Electrically variable etalon spacers 206 and 207 may be used to "tune" the interferometer. Spacers 206 and 207 keep first plate 101 and second plate 102 in a straight and uniform position. A suitable tension can be created and maintained for a movable mirror. Spacers 206 and 207 are not optically active. In some embodiments, spacers 206 and 207 may be an annulus.

Figure 3:
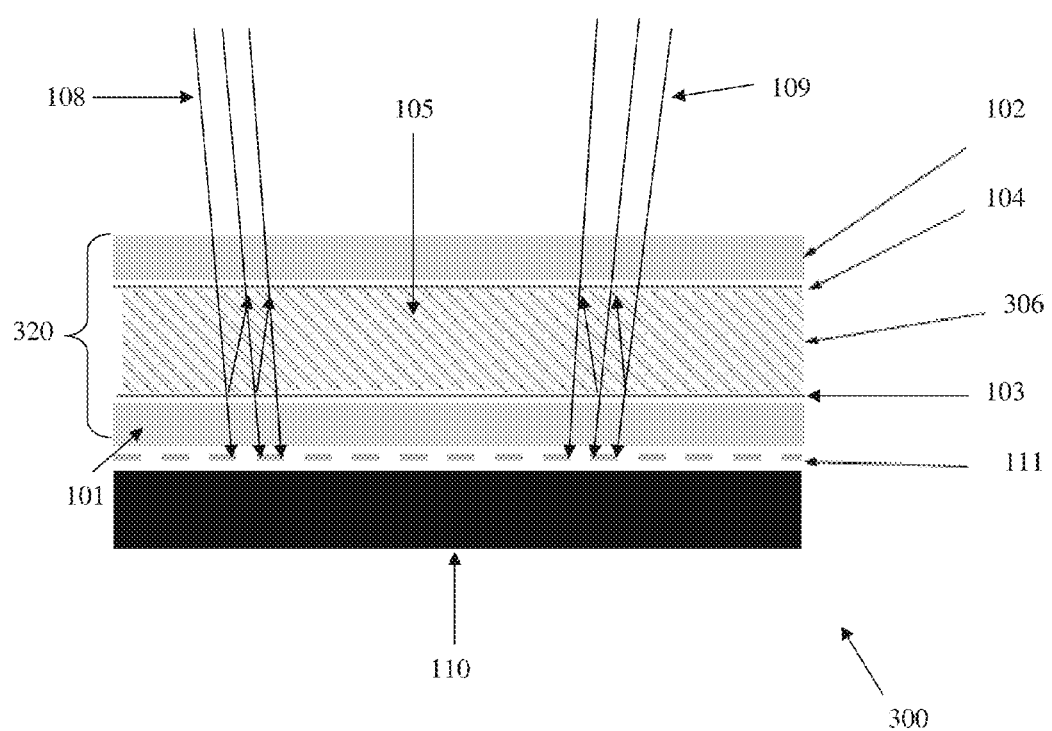
FIG. 3 is a cross-sectional view of another example of a monolithic electromagnetic radiation sensor according to aspects of the present invention.

Referring to FIG. 3, there is illustrated in cross section a portion of an exemplary electromagnetic radiation sensor, indicated generally at 300, in accordance with certain embodiments. FIG. 3 illustrates an example of a solid state interferometer system comprising a Fabry-Perot interferometer 320 in close proximity to an FPA sensor system having a common substrate 110 and detector pixels 111. In some embodiments, electrically variable etalon spacer 306 is disposed within optical gap 105, instead of between the edges of first plate 101 and second plate 102, or external to optical gap 105. Electrically variable etalon spacer 306 may extend over the common substrate 110 comprising detector pixels 111. In some embodiments, electrically variable etalon spacer 306 may completely fill optical gap 105. Electrically variable etalon spacer 306 may be used to "tune" the interferometer. Electrically variable etalon spacer 306 keeps first plate 101 and second plate 102 in a straight and uniform position. A suitable tension can be created and maintained for a movable mirror. Spacer 306 is not optically active.

Electrically variable etalon spacer 306 may be formed by a deposition process, such as a sputtering deposition process. The deposition process may comprise a direct solidification of a vapor by cooling. In some embodiments, the electrically variable etalon spacer 306 may be a piezoelectric crystal. The piezoelectric crystal may have a thickness such that the spectrally selective device is flat and not susceptible to vibrations.

In some embodiments, second plate 102 of the solid state interferometer system may be optional and may be replaced by a reflective coating deposited directly onto the upper surface of the variable etalon spacer 306. In this embodiment, first plate 101 may be deposited above common substrate 110 comprising detector pixels 111. First plate 101 may extend substantially across common substrate 110 comprising detector pixels 111. First plate 101 may extend completely across common substrate 110 comprising detector pixels 111. Reflective coating 103 may be deposited on first plate 101. Electrically variable etalon spacer 306 may be deposited on reflective coating 103. Reflective coating 104 may be deposited on electrically variable etalon spacer 306. Optionally, second plate 102 may be deposited on reflective coating 104. The resulting system provides a solid state interferometer system.

A solid state interferometer system may have advantages over interferometer systems which comprise non-solid state elements. For example, a solid state interferometer system does not require alignment of individual elements, such as etalon spacers and plates. In addition, a solid state interferometer system may be more compact than an interferometer system comprising non-solid state elements, because the spaces between the elements have been eliminated in the solid state.

Figure 4:
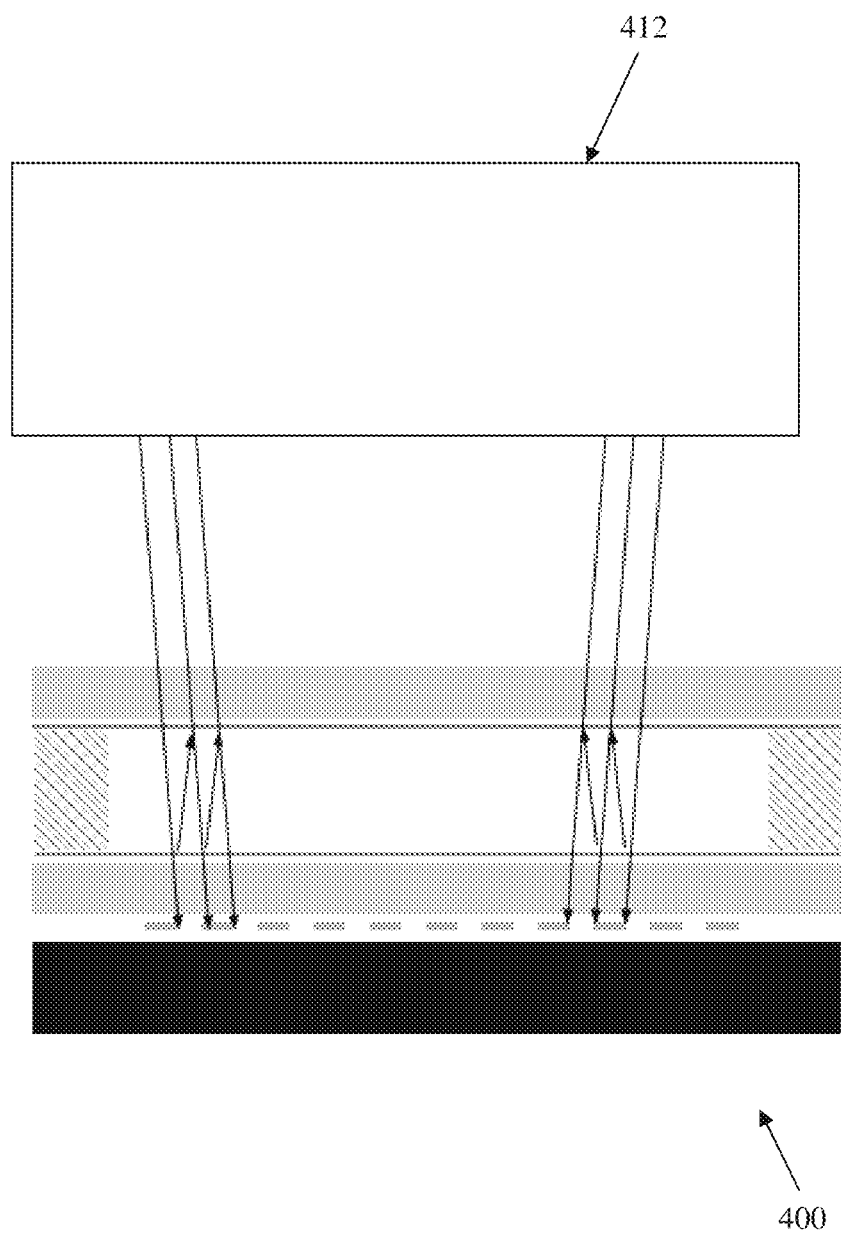
FIG. 4 is a cross-sectional view of one example of a monolithic electromagnetic radiation sensor and optical train according to aspects of the present invention.

FIG. 4 illustrates an electromagnetic radiation sensor 400 in optical connection with an optical train in accordance with an embodiment of the invention. Electromagnetic radiation sensor 400 may be any of the above-discussed embodiments. It is an object of the present invention to provide a spectrally selective device that is compatible with suitable fore-optics. Fore-optics 412 may comprise one or more sources of electromagnetic radiation. Fore-optics 412 may comprise one or more optical elements. For example, fore-optics 412 may comprise one or more mirrors. Fore-optics 412 may comprise one or more optical filters configured to filter electromagnetic radiation.

The electromagnetic radiation sensors and interferometers according to the invention can be designed for usage for any radiation within optical range. For example, the interferometers can be designed for the usage for visible electromagnetic radiation, ultraviolet (UV) radiation, near infrared radiation (NIR), and infrared radiation (IR). It is only necessary to choose materials for the substrate and the mirror structures that are optically transparent for the operating wavelength.

Simulation Example and Results

Figure 5:
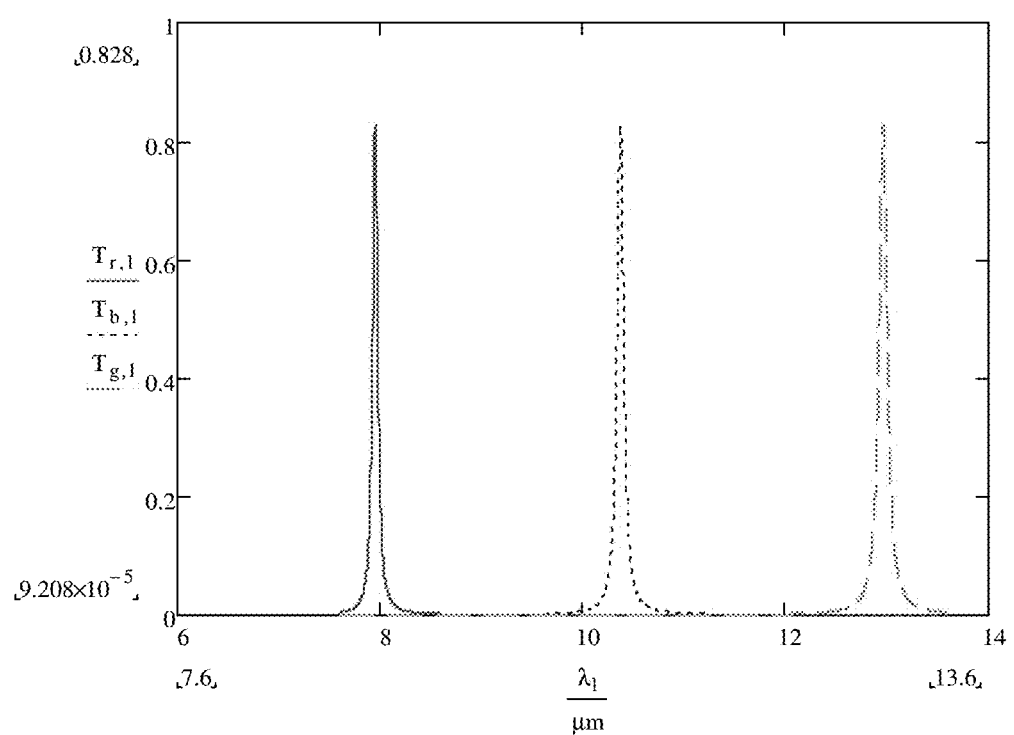
FIG. 5 is a graph illustrating the spectral response of one example of an electromagnetic radiation sensor according to aspects of the present invention.

FIG. 5 illustrates the spectral response of the exemplary imaging system comprising a Fabry-Perot interferometer in close proximity with a focal plane array according to the invention. A spectral response describes the sensitivity of the photosensor to optical radiation of different wavelengths. The spectral sensitivity is the relative efficiency of detection of electromagnetic radiation as a function of the wavelength of the signal. The imaging system operated at a scanning distance of about 8.6 μm. The electromagnetic radiation tested was thermal infrared electromagnetic radiation, with a wavelength range of approximately 8 μm to approximately 12 μm. FIG. 5 shows modeling results of the spectral transmission of the etalon alone for the parameters as described. The spectral response of the detector is multiplied by the spectral transmission of the etalon to calculate the net system spectral response. The wavelength of maximum absorbance is displayed at the top of each peak. As can be seen in FIG. 5, each peak represents approximately equal sensitivities.

The bandgap may be any wavelength region, dependent upon the gap size. It is expected that similar spectral response patterns would result from different spectra used in, including visible electromagnetic radiation, UV radiation, NIR, and IR. The thermal infrared spectrum, however, is the most difficult spectrum in which to perform this imaging function because it requires a high degree of cooling.

Those skilled in the art should appreciate that the parameters and configurations described herein are exemplary and that actual parameters and/or configurations will depend on the specific application in which the disclosed systems and techniques are used. Those skilled in the art should also recognize or be able to ascertain, using no more than routine experimentation, equivalents to the specific embodiments disclosed. For example, those skilled in the art may recognize that the system, and components thereof, according to the present disclosure may further comprise a network or systems or be a component of an imaging system. It is therefore to be understood that the embodiments described herein are presented by way of example only and that, within the scope of the appended claims and equivalents thereto; the disclosed embodiments may be practiced otherwise than as specifically described. The present systems and methods are directed to each individual feature, system, or method described herein. In addition, any combination of two or more such features, systems, or methods, if such features, systems, or methods are not mutually inconsistent, is included within the scope of the present disclosure. The steps of the methods disclosed herein may be performed in the order illustrated or in alternate orders and the methods may include additional or alternative acts or may be performed with one or more of the illustrated acts omitted.

Further, it is to be appreciated that various alterations, modifications, and improvements will readily occur to those skilled in the art. Such alterations, modifications, and improvements are intended to be part of this disclosure, and are intended to be within the spirit and scope of the disclosure. In other instances, an existing facility may be modified to utilize or incorporate any one or more aspects of the methods and systems described herein. Thus, in some instances, the systems may involve connecting or configuring an existing system to comprise a Fabry-Perot interferometer in close proximity to a focal plane array, for example, using the methods and systems comprising a position of a Fabry-Perot mirror controlled at least in part responsive to the wavelength range of the incoming electromagnetic radiation as disclosed herein. Accordingly the foregoing description and figures are by way of example only. Further the depictions in the figures do not limit the disclosures to the particularly illustrated representations.

While exemplary embodiments of the disclosure have been disclosed, many modifications, additions, and deletions may be made therein without departing from the spirit and scope of the disclosure and its equivalents, as set forth in the following claims.

What is claimed is:

1. An interferometer system comprising:
    an optical detector including a substrate and a two-dimensional array of pixels disposed on the substrate, wherein the optical detector is a focal plane array detector; and
    an interferometer disposed proximate the optical detector without an optical element between the interferometer and the optical detector, the interferometer including
        a first plate positioned proximate the substrate and extending over the two-dimensional array of pixels and overlapping multiple pixels of the two-dimensional array of pixels,
        a second plate spaced apart from the first plate and extending over the two-dimensional array of pixels and overlapping the multiple pixels of the two-dimensional array of pixels, the first and second plates defining an optical gap between them, and
        at least two actuatable spacers positioned between and contacting the first plate and the second plate within but not completely filling the optical gap such that the at least two actuatable spacers are separated from one another by at least a portion of the optical gap, the portion of the optical gap extending over the two-dimensional array of pixels and substantially overlapping all of the multiple pixels of the two-dimensional array of pixels, the at least two actuatable spacers being configured to space apart the first and second plates from one another and to selectively alter a thickness of the optical gap.

2. The interferometer system of claim 1, further comprising a reflective coating disposed on interior surfaces of the first plate and the second plate, the interior surfaces being surfaces that face the optical gap.

3. The interferometer system of claim 1, further comprising a microelectromechanical system actuator configured to actuate the spacers to selectively alter the thickness of the optical gap.

4. The interferometer system of claim 1, wherein the at least two actuatable spacers comprise piezoelectric materials.

5. The interferometer system of claim 4, wherein the piezoelectric materials include at least one of lithium tantalite, lithium niobate, lead zirconium titanate, and lanthanum-doped lead zirconium titanate.

6. The interferometer system of claim 1, wherein the at least two actuatable spacers are positioned between the edges of the first plate and the second plate.

7. The interferometer system of claim 1, further comprising fore-optics, the interferometer being positioned between the fore-optics and the optical detector.

8. An interferometer system comprising:
    an optical detector including a substrate and a two-dimensional array of pixels disposed on the substrate, wherein the optical detector is a focal plane array detector; and
    an interferometer disposed proximate the optical detector without an optical element between the interferometer and the optical detector, the interferometer including a first plate positioned proximate the substrate and extending over the two-dimensional array of pixels and overlapping multiple pixels of the two-dimensional array of pixels, a second plate disposed substantially parallel to the first plate, and an annular actuatable spacer positioned between the first and second plates and configured to space apart the first and second plates from one another to provide an optical gap between the first and second plates, the annular actuatable spacer being positioned at edges of the first and second plates and defining a perimeter of the optical gap, the optical gap extending over the two-dimensional array of pixels and substantially overlapping all of the multiple pixels of the two-dimensional array of pixels, and the annular actuatable spacer being further configured to selectively alter a thickness of the optical gap.

9. The interferometer system of claim 8, further comprising a mechanical actuator configured to actuate the annular actuatable spacer to selectively alter the thickness of the optical gap.

10. The interferometer system of claim 8 further comprising an electrical actuator configured to actuate the annular actuatable spacer to selectively alter the thickness of the optical gap.

11. The interferometer system of claim 8 wherein the annular actuatable spacer comprises a piezoelectric material.

12. The interferometer system of claim 11 wherein the piezoelectric material is selected from a group consisting of lithium tantalite ($LiTaO_3$), lithium niobate ($LiNbO_3$), lead zirconium titanate (PZT), and lanthanum-doped lead zirconium titanate (PLZT).

13. The interferometer system of claim 8, further comprising a reflective coating disposed on interior surfaces of the first plate and the second plate, the interior surfaces being surfaces that face the optical gap.

* * * * *